(12) United States Patent
Bhalla et al.

(10) Patent No.: US 9,520,480 B1
(45) Date of Patent: *Dec. 13, 2016

(54) NORMALLY OFF GALLIUM NITRIDE FIELD EFFECT TRANSISTORS (FET)

(71) Applicant: Alpha and Omega Semiconductor Incorporated, Sunnyvale, CA (US)

(72) Inventors: Anup Bhalla, Santa Clara, CA (US); Tinggang Zhu, Cupertino, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/729,396

(22) Filed: Jun. 3, 2015

Related U.S. Application Data

(62) Division of application No. 13/726,102, filed on Dec. 22, 2012, now Pat. No. 9,064,945, which is a division
(Continued)

(51) Int. Cl.
*H01L 21/338* (2006.01)
*H01L 29/66* (2006.01)
(Continued)

(52) U.S. Cl.
CPC ....... *H01L 29/66462* (2013.01); *H01L 29/402* (2013.01); *H01L 29/1029* (2013.01);
(Continued)

(58) Field of Classification Search
CPC ............. H01L 29/66462; H01L 29/778; H01L 29/402; H01L 29/408; H01L 29/7783; H01L 29/7785; H01L 29/7787; H01L 29/788; H01L 29/1029; H01L 29/2003; H01L 29/4235
(Continued)

(56) References Cited

U.S. PATENT DOCUMENTS 6,914,288 B2 * 7/2005 Itou ................. H01L 27/115
257/314
8,338,860 B2 * 12/2012 Bhalla ............... H01L 29/1029
257/192

(Continued)

*Primary Examiner* — Xinning Niu
*Assistant Examiner* — Vu A Vu
(74) *Attorney, Agent, or Firm* — Bo-In Lin

(57) ABSTRACT

A heterostructure field effect transistor (HFET) gallium nitride (GaN) semiconductor power device comprises a hetero junction structure comprises a first semiconductor layer interfacing a second semiconductor layer of two different band gaps thus generating an interface layer as a two-dimensional electron gas (2DEG) layer. The power device further comprises a source electrode and a drain electrode disposed on two opposite sides of a gate electrode disposed on top of the hetero junction structure for controlling a current flow between the source and drain electrodes in the 2DEG layer. The power device further includes a floating gate located between the gate electrode and hetero junction structure, wherein the gate electrode is insulated from the floating gate with an insulation layer and wherein the floating gate is disposed above and padded with a thin insulation layer from the hetero junction structure and wherein the floating gate is charged for continuously applying a voltage to the 2DEG layer to pinch off the current flowing in the 2DEG layer between the source and drain electrodes whereby the HFET semiconductor power device is a normally off device.

8 Claims, 7 Drawing Sheets

Related U.S. Application Data of application No. 12/589,945, filed on Oct. 30, 2009, now Pat. No. 8,338,860.

(51) Int. Cl.
  *H01L 29/10* (2006.01)
  *H01L 29/778* (2006.01)
  *H01L 29/40* (2006.01)
  *H01L 29/417* (2006.01)
  *H01L 29/788* (2006.01)
  *H01L 29/78* (2006.01)
  *H01L 29/20* (2006.01)

(52) U.S. Cl.
  CPC ........ *H01L 29/2003* (2013.01); *H01L 29/408* (2013.01); *H01L 29/41725* (2013.01); *H01L 29/7783* (2013.01); *H01L 29/7785* (2013.01); *H01L 29/7787* (2013.01); *H01L 29/785* (2013.01); *H01L 29/788* (2013.01)

(58) Field of Classification Search
  USPC ........................................................ 438/172
  See application file for complete search history.

(56) References Cited

U.S. PATENT DOCUMENTS

| | | | |
|---|---|---|---|
| 9,064,945 B2* | 6/2015 | Bhalla | H01L 29/778 |
| 2008/0116486 A1* | 5/2008 | Saito | H01L 29/045 |
| | | | 257/192 |
| 2008/0135880 A1* | 6/2008 | Yoshida | H01L 29/408 |
| | | | 257/194 |
| 2008/0273394 A1* | 11/2008 | Kern | G11C 16/28 |
| | | | 365/185.21 |

* cited by examiner

NORMALLY OFF GALLIUM NITRIDE FIELD EFFECT TRANSISTORS (FET)

This application is a Divisional Application, and claims priority of a pending application Ser. No. 13/726,102 filed on Dec. 22, 2012 by the common inventors of this Application. The application Ser. No. 13/726,102 is a Divisional Application of another application Ser. No. 12/589,945 filed on Oct. 30, 2009 and issued into U.S. Pat. No. 8,338,860 on Dec. 25, 2012 by the common inventors of this Application. The benefit of the filing dates are hereby claimed under Title 35 of the United States Code. The disclosures of application Ser. Nos. 12/589,945 and 13/726,102 are hereby incorporated by reference.

BACKGROUND OF THE INVENTION

1. Field of the Invention

The invention relates generally to the configurations and methods of manufacturing the semiconductor devices. More particularly, this invention relates to a gallium nitride (GaN)-based field effect transistor implemented with new device configurations and manufacturing methods for a normally-off GaN-based field effect transistor that has an extremely small ON resistance in conducting a large amount of electric current.

2. Description of the Prior Art

Conventional methods of configuring and manufacturing a gallium nitride (GaN) based field effect transistors (FETs) are still continuously challenged with a technical issue for providing a normally-off FET transistor that has simple and convenient manufacturing and operating configurations. Specifically, gallium nitride (GaN) based FETs have been implemented to make high electron mobility transistors (HEMTs). For applications of the power transistors, this type of transistor may replace some power devices implemented with power metal-oxide-semiconductor (MOS) field-effect transistor using a silicon-based semiconductor that are commonly and widely used now. Compared to the silicon-based MOS-FET (or MOSFET) semiconductor power devices, the GaN-based transistors can further reduce the on-resistance and realize higher breakdown voltage by taking advantage of the semiconductor material characteristic of a wide band-gap. Furthermore, this high electron mobility transistor can also provide high speed switching and high sensitivity operations relative to the performance of the silicon-based MOSFET devices.

The basic principle of achieving the high electron mobility is achieved by bonding two different kinds of semiconductor materials with different band gaps. A two dimensional electron gas (2DEG) layer is generated at the interface thus serving as a current path comprising a flow of electrons in this electron gas layer. A specific example is illustrated in FIG. 1 with an aluminum gallium nitride (AlGaN) epitaxial grown on top of gallium nitride (GaN) layer. With different band gaps of these two materials, a two dimensional electron gas layer (2DEG) is generated in the boundary, referred to as an AlGaN/GaN hetero-junction, between these two semiconductor materials. Typically, the AlGaN/GaN hetero junction structure is supported on insulating substrate, such as a sapphire substrate. The transistor further includes a source electrode S and a drain electrode D which are arranged on two opposite sides of a gate electrode G formed onto the AlGaN layer that spreads between the source electrode S and the drain electrode D.

With the AlGaN layer functioning as an electron supply layer and supplies electrons to the 2DEG in the undoped GaN layer, the electrons in the electron gas layer transmits between the source electrode and the drain electrode even when there is no control voltage applied to the gate. The high electron mobility transistor (HEMT) configuration as that shown in FIG. 1 thus operates in a normally-on mode unless a voltage is applied to the gate to pinch off the current flow between the source and the drain electrode. A requirement to continuous apply a pinch off voltage to the gate in order to turn off the transistor thus leads to additional power consumptions and may often cause a more complicated device control process for implementing such transistor in an electronic device. In addition most applications are designed for normally-off transistors and so this device would not be suitable to those applications. For these reasons, it is desirable to provide new and improved configurations for manufacturing GaN-based transistors such that the device is normally-off, without requiring application of a pinch-off voltage to the gate.

Most of the AlGaN/GaN hetero structure field effect transistors (HFETs) are provided as depletion mode metal-semiconductor FET (MESFET) in order to achieve a low on resistance RdsA (drain-to-source resistance*area). Enhancement mode MESFET devices with threshold voltage Vth between 0.3 to 0.7 volts have been disclosed. But these types of transistors cannot be driven by a gate voltage between the traditional gate voltage of ten to fifteen volts. Also, various efforts have been attempted to build enhancement mode metal insulator semiconductor FET (MISFET) on a p-GaN layer using different gate dielectrics including silicon nitride ($Si_3N_4$), silicon oxide ($SiO_2$) and gadolinium oxide ($Gd_2O_3$). However, such devices suffer the disadvantages of low inversion mobility and a very high electric field in the oxide when the device is biased into the breakdown thus causing device reliability concerns. In order to address this issue, an oxide layer with increased thickness had been implemented, but that degraded the transconductance and lead to an undesirable higher RdsA.

For all these reasons, there are great and urgent demands to improve the device structure with low RdsA while not disturbing the conductivity of the two-dimensional electron gas (2DEG) layer. In the meanwhile, it is desirable that the device may be operated as a normally off device without applying a voltage to the gate such that the above-discussed difficulties and limitations may be resolved.

SUMMARY OF THE PRESENT INVENTION

It is therefore an aspect of the present invention to provide a new and improved device configuration and manufacturing method to provide a heterostructure field effect transistor (HFET) power device that provides simple and convenient manufacturing and operating processes to implement the HFET device as a normally-off device such that the above discussed difficulties and limitations may be resolved.

Specifically, it is an aspect of the present invention to provide improved device configuration and method for manufacturing a semiconductor GaN-based HFET power device with negatively charged floating gate to deplete the channel when no voltage is applied to the gate. The negative charged floating gate is formed by applying a similar process as for forming a floating gate commonly implemented in flash memory, which is a mature and well known technology. A gate voltage is applied to offset the negatively charged floating gate to restore the 2DEG channel formed on the hetero junction between the GaN and AlGaN layers.

It is another aspect of the present invention to provide improved device configuration and method for manufacturing a multiple-channel semiconductor GaN-based HFET power device with negatively charged floating gate formed as wrap-around floating gate to deplete the multiple channels when no voltage is applied to the gate. The negative charged floating gate is provided by applying a similar process as a floating gate commonly implemented in flash memory. A gate voltage is applied to offset the negatively charged wrap-around floating gate to restore the 2DEG channels formed on the hetero junctions between multiple layers of GaN and AlGaN interfaces.

It is another aspect of the present invention to provide improved device configuration and method for manufacturing a semiconductor GaN-based HFET power device with negatively charged gate oxide layer to deplete the channel when no voltage is applied to the gate. The negative charged gate oxide may be provided by fluorine treatment or a similar process to deposit fixed negative charges into the gate oxide layer. A gate voltage is applied to offset the negatively charged gate oxide to restore the 2DEG channel formed on the hetero-junction between the GaN and AlGaN layers.

Briefly in a preferred embodiment this invention discloses a heterostructure field effect transistor (HFET) gallium nitride (GaN) semiconductor power device. The power device comprises a hetero junction structure comprises a first semiconductor layer interfacing a second semiconductor layer of two different band gaps thus generating an interface layer as a two-dimensional electron gas (2DEG) layer. The power device further comprises a source electrode and a drain electrode disposed on two opposite sides of a gate electrode disposed on top of the hetero junction structure for controlling a current flow between the source and drain electrodes in the 2DEG layer. The power device further comprises a floating gate located between the gate electrode and hetero junction structure, wherein the gate electrode is insulated from the floating gate with an insulation layer and wherein the floating gate is disposed above and padded with a thin insulation layer from the hetero junction structure and wherein the floating gate is charged for continuously applying a voltage to the 2DEG layer to pinch off the current flowing in the 2DEG layer between the source and drain electrodes whereby the HFET semiconductor power device is a normally off device. In another embodiment, the first semiconductor layer is a gallium nitride (GaN) layer and the second semiconductor layer is an aluminum gallium nitride (AlGaN) layer disposed on top of the gallium nitride layer. In another embodiment, the semiconductor power device further includes a sapphire substrate for supporting the hetero junction structure thereon. In another embodiment, the floating gate is negatively charged to shift a pinch off voltage of the 2DEG layer from a negative pinch off voltage to a positive pinch off voltage. In another embodiment, the first semiconductor layer is an N-type gallium nitride layer and the second semiconductor layer is an N-type AlGaN layer disposed on top of the gallium nitride layer. In another embodiment, the floating gate is negatively charged to shift a pinch off voltage of the 2DEG layer from a negative pinch off voltage to a positive pinch off voltage equal to or greater than three volts (3.0V). In another embodiment, the source electrode further includes an extended field plate extending from the source electrode and covering over the gate electrode. In another embodiment, the source electrode further includes an extended field plate extending from the source electrode and covering over the gate electrode wherein the field plate is insulated from the gate electrode with a thick insulation layer. In another embodiment, the hetero junction structure comprises the first and second semiconductor layers constituting a rectangular block with a longitudinal direction extending from the source electrode to the drain electrode. And, the gate electrode and the floating gate with the insulation layers constitute a wrap-around gate wrapping around a middle segment of the rectangular block around sidewalls and a top surface of the middle segment of the rectangular block to control the 2DEG layer generated between the first and second semiconductor layers. In another embodiment, the hetero junction structure comprises the first and second semiconductor layers constituting the rectangular block wherein the first and second semiconductor layers of two different band gaps are vertically oriented. In another embodiment, the semiconductor power device further includes at least a third semiconductor layer disposed immediately next to each other with two adjacent semiconductor layers having two different band gaps for generating at least two interface layers as at least two two-dimensional electron gas (2DEG) layers.

These and other objects and advantages of the present invention will no doubt become obvious to those of ordinary skill in the art after having read the following detailed description of the preferred embodiment, which is illustrated in the various drawing figures.

DETAILED DESCRIPTION OF THE EMBODIMENTS

Figure 2:
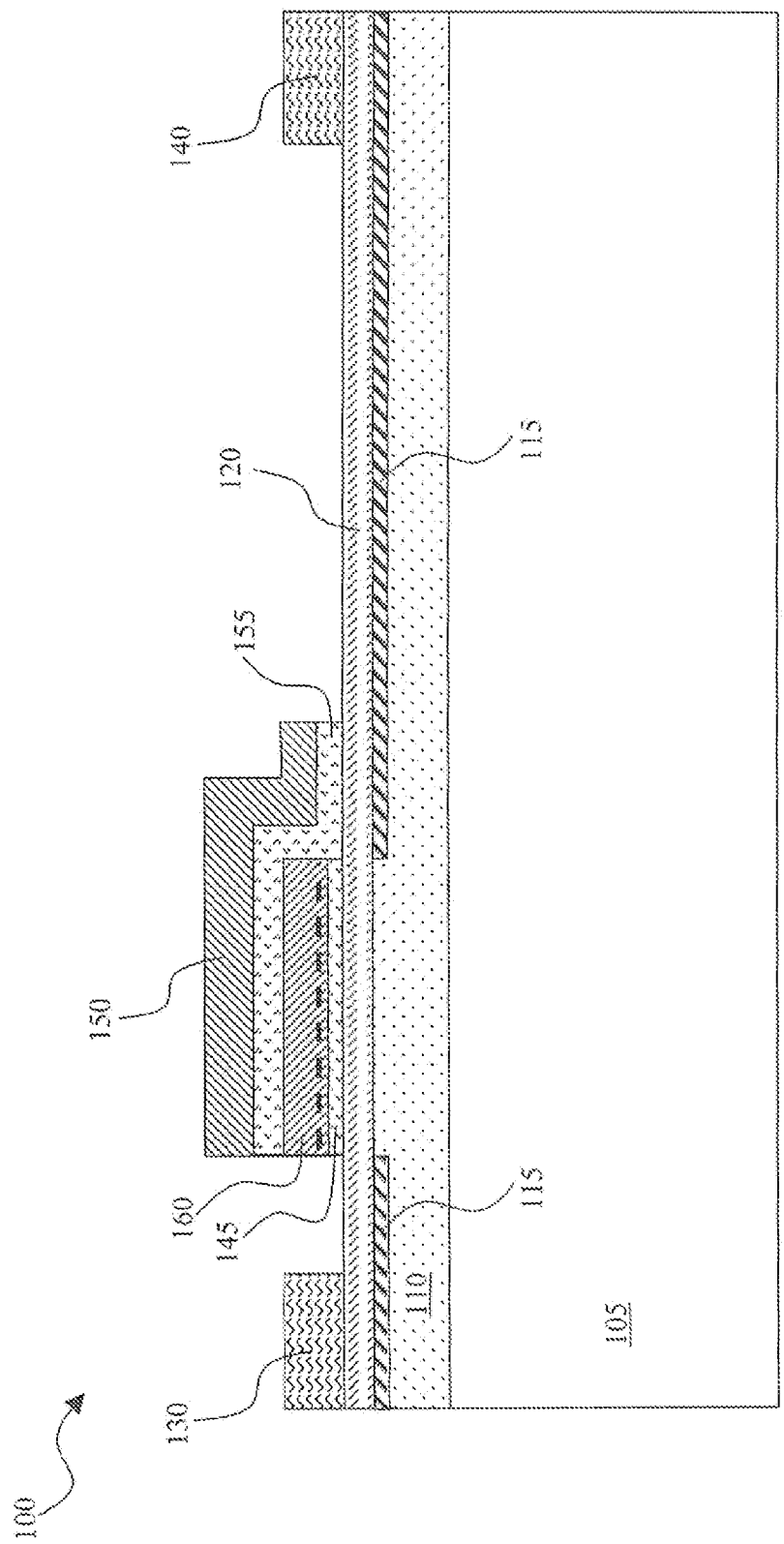
FIG. 2 is a cross sectional view of a HFET power device of this invention with negative charged floating gate to deplete the channel for operating the transistor as a normally-off device.

Referring to FIG. 2 for a cross sectional view of a heterostructure field effect transistor (HFET) semiconductor power device 100 of this invention. The HFET semiconductor power device 100 comprises an AlGaN layer 120 epitaxial grown on top of gallium nitride (GaN) layer 110 thus forming a AlGaN/GaN hetero junction with a two-dimensional electron gas (2DEG) 115 located at the interface. The AlGaN/GaN hetero junction structure is supported on a sapphire substrate 105. A source electrode 130 and a drain 140 are disposed on two opposite sides of a gate electrode 150 to control the current flow through the 2DEG layer 115. The gate electrode 150 is insulated from the N-doped AlGaN layer 120 with a thicker gate oxide layer 155. In order to configure the HFET power device as a normally off device, a floating gate 160 is formed beneath at least a portion of the gate oxide layer 155. The floating gate 160 is insulated from the AlGaN layer 120 with a thin oxide layer 145, and from the gate electrode 150 by gate oxide 155.

The floating gate 160 is negatively charged and is configured to shift the pinch off voltage from a negative pinch off voltage to a positive pinch off voltage. For example, the pinch off voltage Vp was originally −4.0 volts without the negatively charged floating gate, is now shifted to a pinch off voltage of +3 volts with the negatively charged floating gate 160. Without an external applied voltage to the gate electrode 150, the floating gate 160 automatically pinches off the 2DEG 115. The gate electrode 150 overlaps the negatively charged floating gate 160 and is insulated from it with a thick oxide layer 155. The gate electrode 150 is applied a voltage to control the electric field. The function of the gate electrode 150 is therefore not to invert the channel. The function of the gate electrode 150 is to cancel the negative charges on the floating gate 160, which would then allow the 2DEG 115 to form uninterrupted between source 130 and drain 140 and thus turn on the device. The negative charges may be injected, e.g., written to the floating gate 160 in a same manner as charges are written to flash memory devices.

Figure 3:
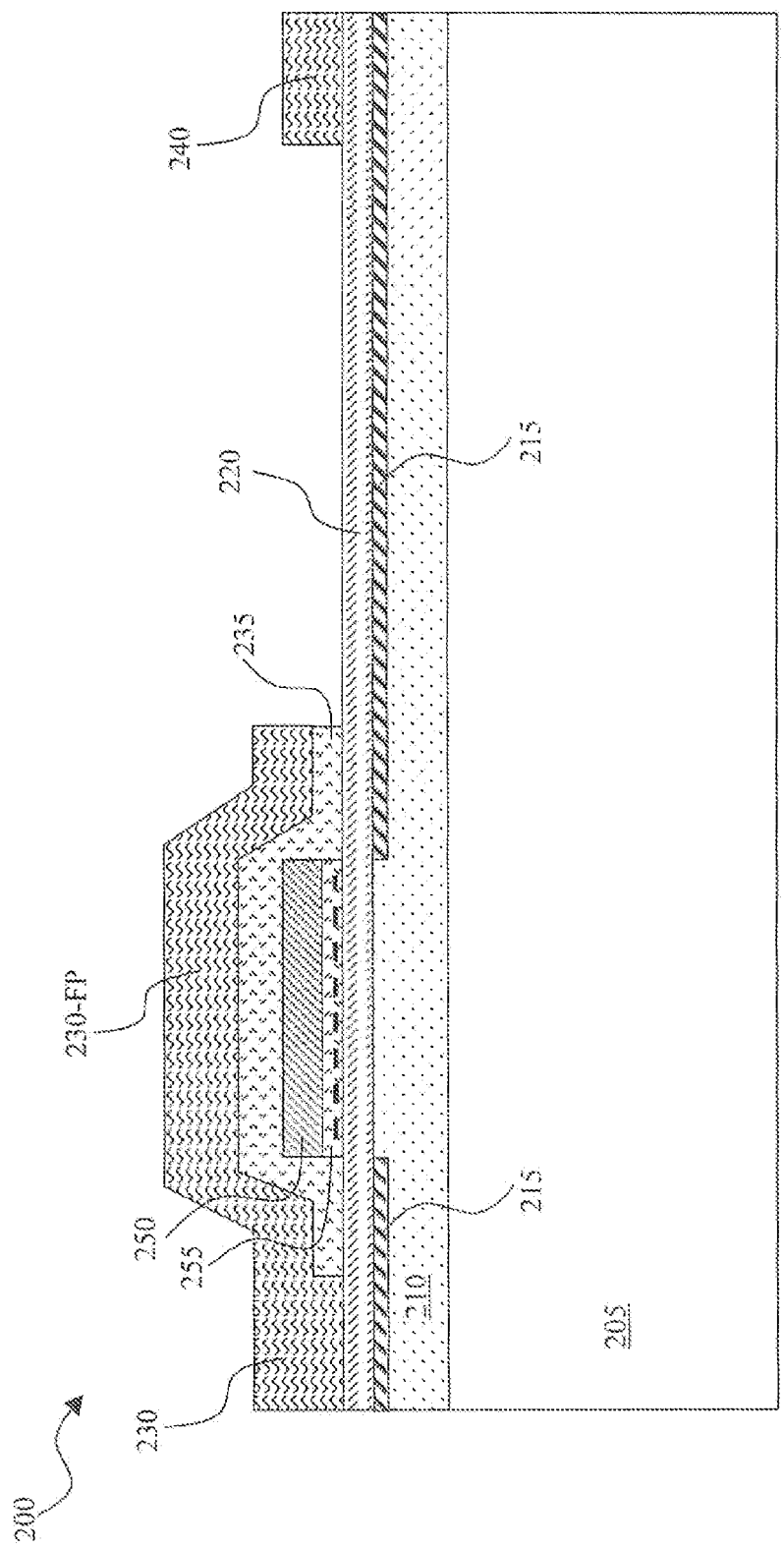
FIG. 3 is a cross sectional view of a HFET power device of this invention with negative charged gate oxide layer to deplete the channel for operating the transistor as a normally-off device.

Referring to FIG. 3 for a cross sectional view of another hetero structure field effect transistor (HFET) semiconductor power device 200 of this invention. The HFET semiconductor power device 200 has a similar AlGaN/GaN hetero junction structure with a two-dimensional electron gas (2DEG) layer 215 formed at an interface layer between a gallium nitride (GaN) layer 210 and AlGaN layer 220. The AlGaN/GaN hetero junction structure is supported on a sapphire substrate 205. A source electrode 230 and a drain 240 are disposed on two opposite sides of a gate electrode 250 to control the current flow through the 2DEG layer 215. The source electrode 230 is formed with an extended field plate 230-FP that extends and covers over the gate electrode 250 to reduce the gate oxide peak field near the drain electrode 240. The extended field plate 230-FP is insulated from the gate electrode 250 by a thick oxide 235. The gate electrode 250 is insulated from the N-doped AlGaN layer 220 with a gate oxide layer 255. In order to configure the HFET power device as a normally off device, fixed negative charges are stored, e.g., in the same manner charges are stored in flash memory, in the gate oxide layer 255 by fluorine treatment into AlGaN layer or alternate processes during the manufacturing process. The negative charges fixed in the gate oxide layer 255 drive off the electrons in the 2DEG layer 215 thus depleting the channel. A voltage applied to the gate electrode 250 offsets the negative charges to allow the 2DEG layer 215 to return to a conduction mode. Therefore, a normally-off HFET device is achieved without degrading the electron mobility.

Figure 1:
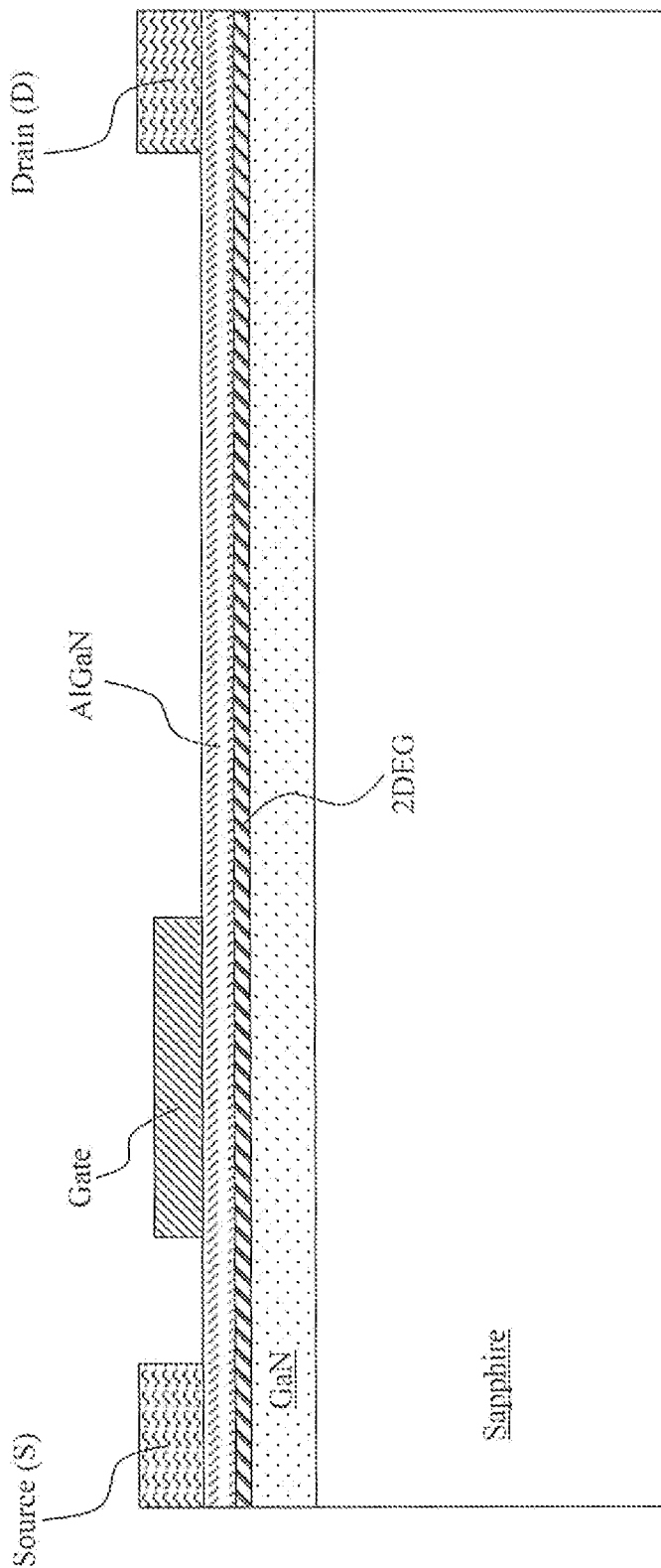
FIG. 1 is cross sectional view to show a conventional normally-on GaN-based HFET power device.
Figure 4:
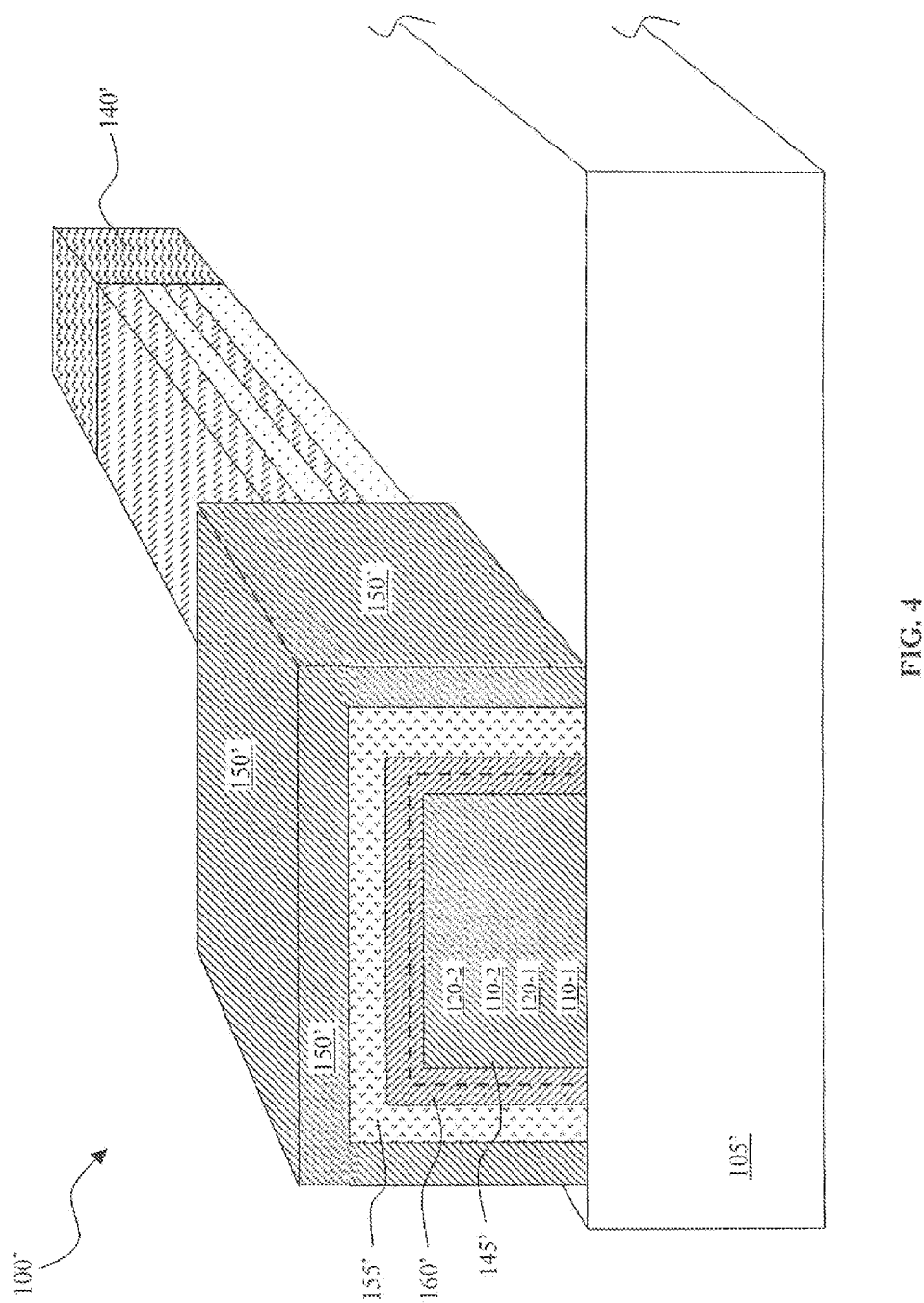
FIG. 4 is a cross sectional perspective view of a multiple-channel HFET power device of this invention with negative charged floating gate configured as wrap-around floating gate to deplete the channel for operating the transistor as a normally-off device.
Figure 5:
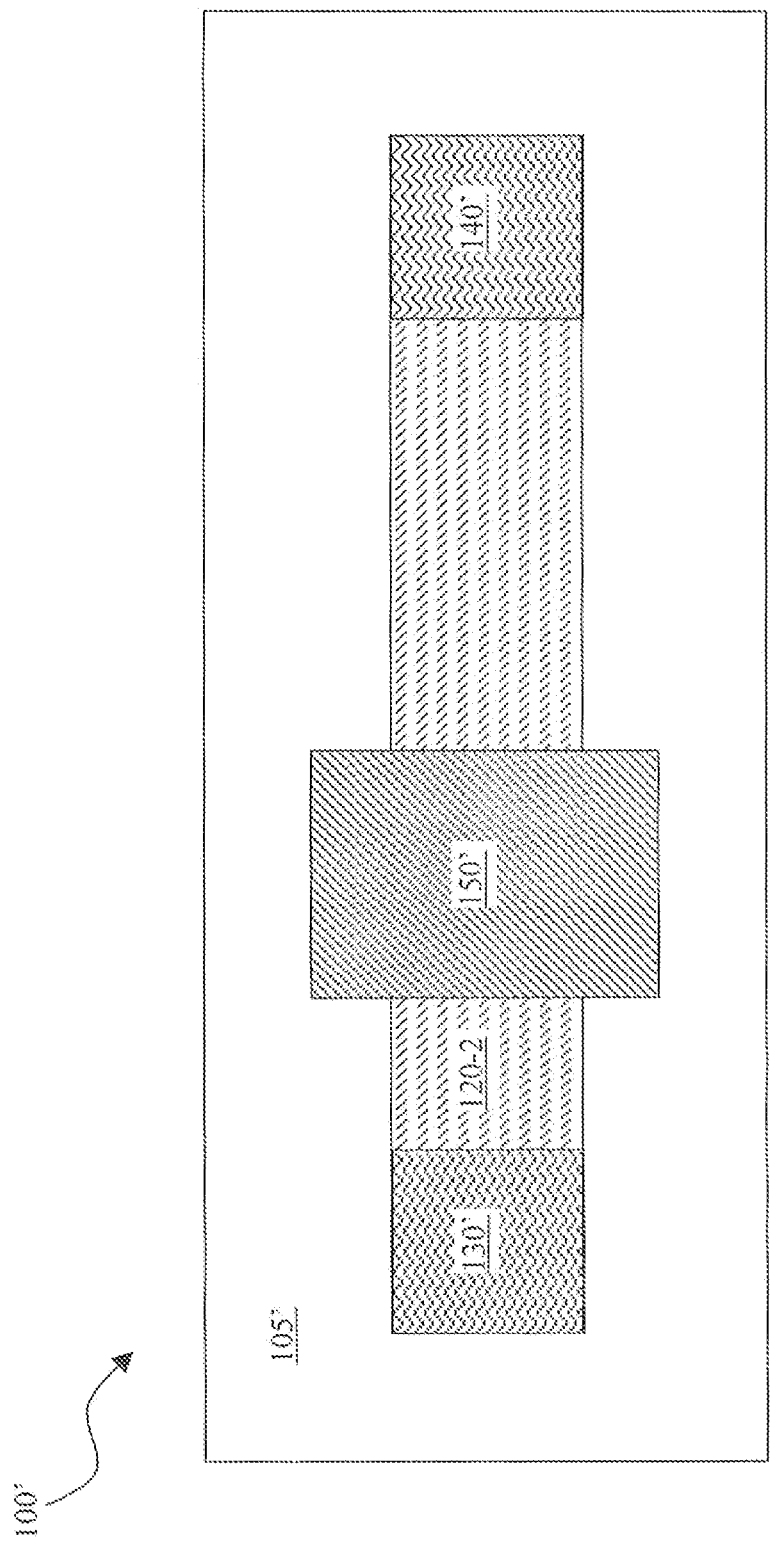
FIG. 5 is a top view of the HFET power device of FIG. 4.

FIG. 4 is a partial/cross sectional perspective view to show an alternate embodiment of a HFET power device 100' of this invention. The HFET power device 100' is similar in structure as that shown in FIG. 1. The HFET power device 100' includes three AlGaN/GaN hetero junctions between two layers of GaN layers 110-1 and 110-2 and two layers of AlGaN layers 120-1 and 120-2 respectively thus forming three channels of 2DEG layers (not specifically shown but the same as FIGS. 1-3)—one 2DEG channel at each of the AlGaN/GaN hetero-junctions. The gate electrode 150' is insulated from the negative charged floating gate 160' with a thick oxide layer 155'. The negatively charged floating gate 160' surrounds the hetero junctions on both the top and on both sides of the hetero junctions formed between the GaN and AlGaN layers. A wrap-around configuration of the negatively charged floating gate 160' would further assure complete depletion of the channels thus reliably providing a normally-off multi-channel HFET power device 100' with increased electric current flows between the source electrode 130' (not shown in FIG. 4) to the drain electrode 140', due to the multiple channels provided by the AlGaN/GaN layers 110-1, 120-1, 110-2, 120-2. FIG. 4 shows a cross section to illustrate the gate and channel structure of the HFET power device 100'. FIG. 5 shows a top view of HFET power device 100' to illustrate the relative positioning of the source electrode 130', gate electrode 150' and drain electrode 140'.

Figure 6:
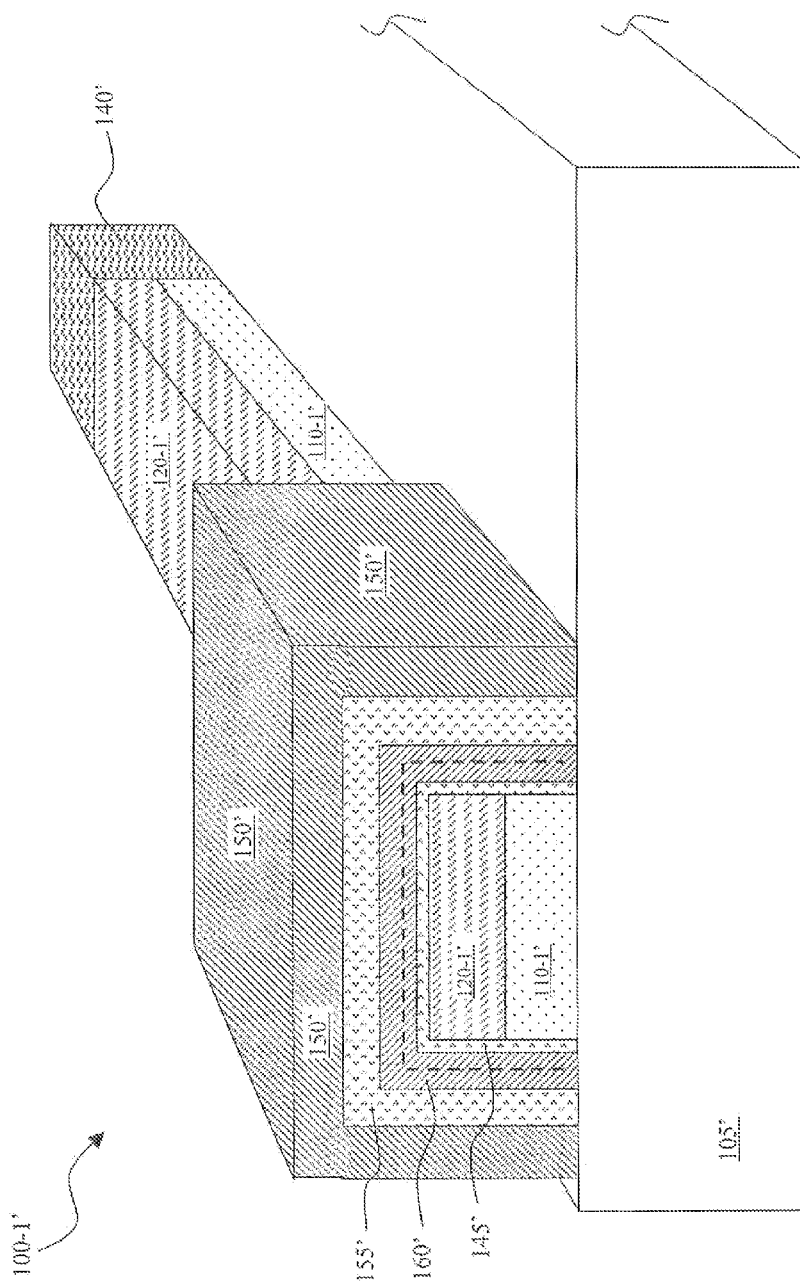
FIGS. 6 and 7 are cross sectional perspective views of alternative embodiments of HFET power devices of this invention similar to that of FIG. 4.

FIG. 6 shows a partial perspective view to show an alternative embodiment of a HFET power device 100-1'. It is similar to HFET power device 100' of FIGS. 4 and 5, except that the two layers of GaN layers 110-1 and 110-2 and two layers of AlGaN layers 120-1 and 120-2 of HFET power device 100' are replaced with just a single layer of GaN 110-1' and a single layer of AlGaN 120-1'. The HFET power device 100-1' has only a single 2DEG channel disposed between the AlGaN layer 120-1' and the GaN layer 110-1', but the floating gate 145' is still wrapped around to improve control of the hetero-junction.

Figure 7:
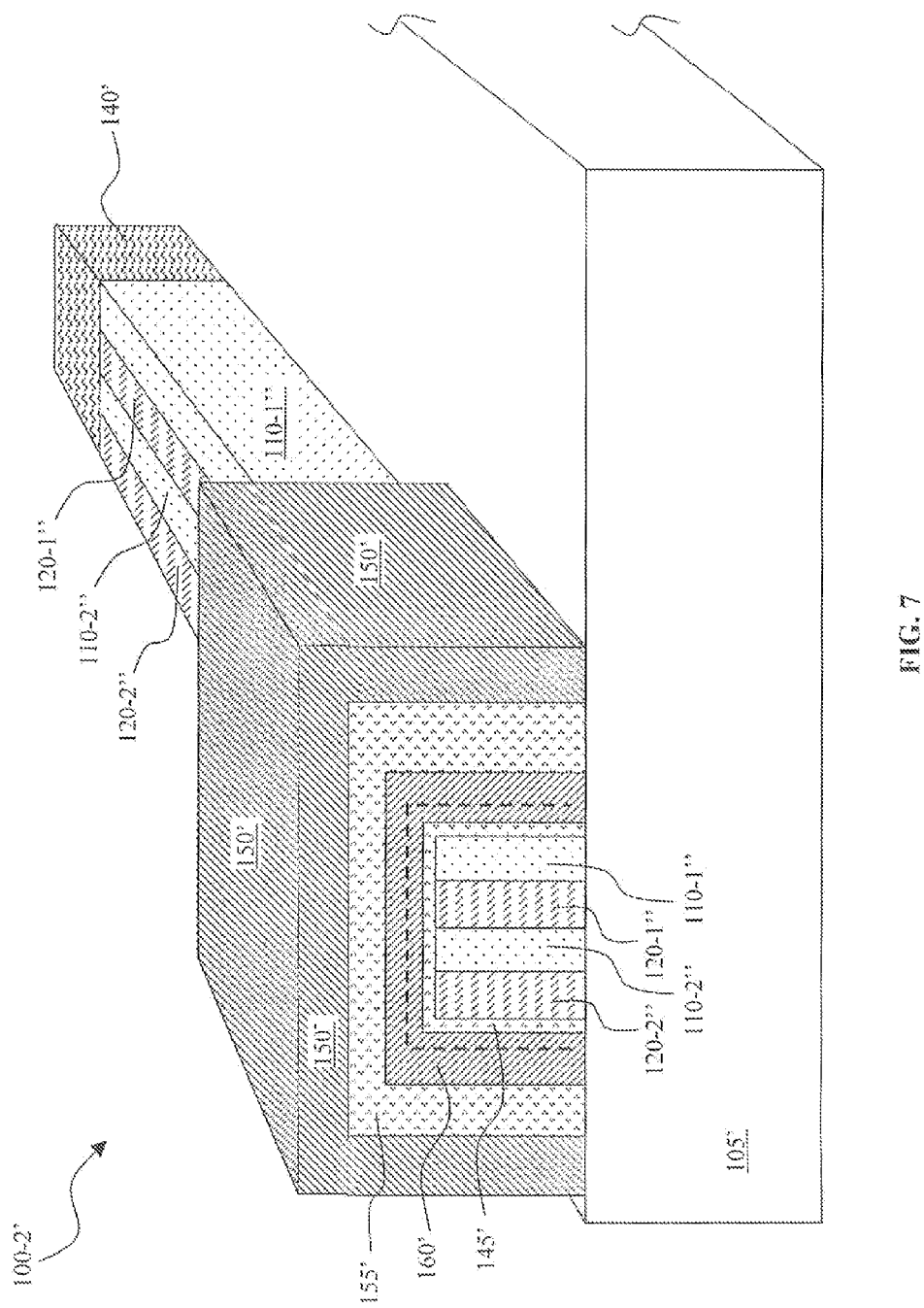

FIG. 7 shows a partial perspective view to show an alternative embodiment of a HFET power device 100-2'. It is similar to HFET power device 100' of FIGS. 5 and 6, except that the two layers of GaN layers 110-1 and 110-2 and two layers of AlGaN layers 120-1 and 120-2 of HFET power device 100' are replaced with two vertical layers of GaN layers 110-1" and 110-2" and two vertical layers of AlGaN layers 120-1" and 120-2". The vertically oriented layers mean that the hetero junctions GaN/AlGaN are vertically oriented and thus the 2DEG channels are vertically oriented as well. In this case the wrap-around floating gate 160' may be more effective in pinching off the 2DEG channels.

According to above drawings and descriptions, the present invention discloses a method of forming a heterostructure field effect transistor (HFET) gallium nitride (GaN) semiconductor power device. The method includes steps of forming a hetero-junction structure from a first semiconductor layer interfacing a second semiconductor layer having different band gaps to make a two dimensional gas (2DEG) at the hetero junction; forming a source electrode and drain electrode on opposite ends of the 2DEG; forming a floating gate over a portion of the 2DEG, between the source and drain electrodes; and forming a gate electrode over the floating gate, the gate electrode being insulated from the floating gate by an insulating layer; wherein the floating gate is charged such that it depletes the 2DEG so that the device HFET semiconductor device is normally off, and wherein the gate electrode cancels the charge of the floating gate to turn the device on. In another embodiment, the step of forming a hetero junction structure from a first semiconductor layer comprising GaN interfacing a second semiconductor layer comprising Aluminum gallium nitride (AJGaN). In another embodiment, the method further includes a step of forming the floating gate with a built-in negative charge. In another embodiment, the method further includes a step of forming the floating gate with negative charge includes a step of writing the negative charges into the floating gate in a similar manner as charge is written to flash memory. In another embodiment, the method further includes a step of wrapping the floating gate and gate electrode around the sidewalls and top of the hetero junction structure. In another embodiment, the method further includes a step of insulating the floating gate from the hetero junction structure with a thin insulating layer.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

What is claimed is:

1. A method of forming a heterostructure field effect transistor (HFET) gallium nitride (GaN) semiconductor power device comprising:

forming a hetero junction structure from a plurality of first semiconductor layers interfacing a plurality of second semiconductor layers having different band gaps to make a plurality of two dimensional gas (2DEG) at the hetero-junctions;

forming a source electrode and drain electrode on opposite ends of the 2DEG;

forming a floating gate covering over and wrapping around a portion of the 2DEG, between the source and drain electrodes;

forming a gate electrode covering over and wrapping around said floating gate and applying an insulation layer to insulate the gate electrode from the floating gate by an insulating layer; and charging the floating gate to deplete the 2DEG for operating the HFET semiconductor device in a normally off condition and turning on the semiconductor power device by applying a voltage to the gate electrode for canceling the charge of the floating gate.

2. The method of claim 1 wherein:

the step of forming the hetero junction structure further comprises a step of forming the plurality of the first semiconductor layer comprising GaN interfacing the plurality of the second semiconductor layer comprising Aluminum gallium nitride (AlGaN).

3. The method of claim 1 wherein:

the step of charging the floating gate to deplete the 2DEG further comprises a step of forming the floating gate with a built-in negative charge.

4. The method of claim 1 wherein:

the step of charging the floating gate to deplete the 2DEG further comprises a step of writing negative charges into said floating gate by applying a similar process of writing charges to a floating gate of a flash memory.

5. The method of claim 1 further comprising:

forming the HFET gallium nitride (GaN) semiconductor power device on a sapphire substrate for supporting the hetero junction structure thereon.

6. The method of claim 1 wherein:

the process of forming the floating gate further comprises a step of forming the floating gate with the negatively charged potential to shift the pinch off voltage of the 2DEG layer from a negative pinch off voltage to a positive pinch off voltage equal to or greater than three volts (3.0V).

7. The method of claim 1 wherein:

the step of forming the source electrode further includes a step of forming the source electrode with an extended field plate extending from the source electrode and connecting to the gate electrode wrapping around the floating gate.

8. The method of claim 1 wherein:

the step of forming the source electrode further includes a step of forming an extended field plate extending from the source electrode and connecting to the gate electrode wrapping around the floating gate wherein the field plate is insulated from the floating gate with an insulation layer.

* * * * *